United States Patent
Bitan et al.

(10) Patent No.: US 10,652,479 B2
(45) Date of Patent: May 12, 2020

(54) HDR IMAGE SENSOR WITH LFM AND REDUCED MOTION BLUR

(71) Applicant: SAMSUNG ELECTRONICS CO., LTD., Suwon-si, Gyeonggi-Do (KR)

(72) Inventors: Gal Bitan, Petach-Tikva (IL); Shay Hamami, Ganey-Tikva (IL)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 51 days.

(21) Appl. No.: 16/135,647

(22) Filed: Sep. 19, 2018

(65) Prior Publication Data
US 2020/0092459 A1    Mar. 19, 2020

(51) Int. Cl.
| | |
|---|---|
| H04N 9/73 | (2006.01) |
| H04N 5/235 | (2006.01) |
| H01L 27/146 | (2006.01) |
| H04N 5/376 | (2011.01) |
| H04N 5/232 | (2006.01) |
| H04N 5/353 | (2011.01) |

(52) U.S. Cl.
CPC ..... H04N 5/2357 (2013.01); H01L 27/14643 (2013.01); H04N 5/2355 (2013.01); H04N 5/23264 (2013.01); H04N 5/353 (2013.01); H04N 5/3765 (2013.01)

(58) Field of Classification Search
CPC .. H04N 5/3535; H04N 5/2327; H04N 5/2353; H04N 5/2355; H04N 5/2357; H04N 5/35581; H04N 5/378; H04N 5/35554; H04N 5/35563
See application file for complete search history.

(56) References Cited

U.S. PATENT DOCUMENTS

| | | | |
|---|---|---|---|
| 10,136,084 B1* | 11/2018 | Solheim | H04N 5/37452 |
| 10,397,500 B1* | 8/2019 | Xu | H04N 5/3559 |
| 2017/0094203 A1* | 3/2017 | Barna | H04N 5/2327 |
| 2017/0366764 A1* | 12/2017 | Innocent | H04N 5/3575 |
| 2018/0091723 A1* | 3/2018 | Funaki | H04N 5/379 |
| 2018/0109715 A1* | 4/2018 | Mangla | H04N 5/2355 |
| 2019/0260949 A1* | 8/2019 | Geurts | H01L 27/14609 |

* cited by examiner

*Primary Examiner* — Kelly L Jerabek
(74) *Attorney, Agent, or Firm* — F. Chau & Associates, LLC (57) ABSTRACT

An HDR image sensor supporting LED Flicker Mitigation to reduce Motion Blur and a method of operating same are provided. A timing controller circuit generates at least one control signal that controls an operation of the image sensor. A split-photodiode (PD) pixel includes at least two or more photodiodes that may be independently exposed to one or more bursts of light from a light source. A first photodiode of the two or more photodiodes has a first exposure period that is longer in duration than a second exposure period of a second photodiode of the two or more photodiodes. The second photodiode performs a fragmented exposure operation in which a plurality of exposure periods of the second photodiode are shorter in duration than the first exposure period of the first photodiode, and include both continuous and fragmented exposure periods to capture the one or more bursts of light.

18 Claims, 7 Drawing Sheets

HDR IMAGE SENSOR WITH LFM AND REDUCED MOTION BLUR

TECHNICAL FIELD

The following relates generally to image sensor technology, and more specifically to LED flicker mitigation in image sensors.

DISCUSSION OF RELATED ART

High Dynamic Range (HDR) imaging is a technique used to reproduce a greater dynamic range of luminance with, for example, standard digital imaging. HDR sensors are image sensors that may be used in extreme dynamic range applications. HDR image sensors are being used in increasing frequency in numerous applications including automotive applications, such as side and rear view camera monitoring systems (CMS) that can replace or supplement rear view and side mirrors, thereby eliminating blind spots and reducing problems with glare.

A pixel in conventional lighting may include three continuous exposures, that may be, for example, medium and short exposures, and this arrangement may be subject to having issues with flicker. In the case of HDR sensors, a pixel with three continuous exposures may be configured so that the continuous exposures are medium and short exposures. The exposures may be executed in a sequence. Such a structure has posed a challenge to manufacturers and users alike, particularly when HDR sensors are implemented, for example, in certain vision systems. LED usage has become more widespread because of their efficient use of energy and superior brightness when compared with conventional lighting, and thus LED lights are becoming more popular for use in outdoor illumination, such as illuminated traffic signs, flood lights, headlights and tail lights of motor vehicles and bicycles, etc.

However, LED lighting can negatively affect the operation of image sensors, particularly HDR sensors. For example, LEDs may be modulated with "on" times that are sometimes smaller than the HDR sensor frame rate. In such instances, it is possible that short exposures may not overlap with the LED "on" time, causing the short exposure image to perceive the LED as being "off". For example, in the case of HDR sensors, the medium exposures may perceive the LED as being "on", and the short exposures may perceive the LED as being "off". Since the coincidence between the LED "on" time and the sensor exposure may result in that some frames perceive the LED as being "on" and others as being "off". This variation in the LED state in the captured image sequence is regarded as LED flicker.

Some attempts to mitigate the LED flicker (e.g., LED Flicker Mitigation) has resulted in blurry images. For example, operating the HDR sensor with an increased exposure time and then compensating for the increased exposure time by reducing the sensor responsivity, or by fragmenting the exposures. However, the aforementioned attempt to mitigate LED flicker may create unacceptable amounts of image blur.

SUMMARY

An apparatus for light emitting diode (LED) flicker mitigation in image sensors is described. The apparatus may include a timing controller circuit that generates at least one control signal that controls an operation of the image sensor, at least one pixel, in which the at least one pixel comprises a split photodiode pixel including at least two or more photodiodes that are configured to be exposed to one or more bursts of light from a light source, the at least two or more photodiodes are configured to be exposed and blanked independently of each other, the two or more photodiodes include a first photodiode that has a first exposure period that is longer in duration than a second exposure period of a second photodiode of the two or more photodiodes, and the timing controller circuit is configured to control a plurality of exposures performed by the second photodiode of the at least one pixel to include a fragmented medium exposure, a continuous medium exposure, a fragmented short exposure, and a continuous short exposure, wherein the fragmented medium exposure and the continuous medium exposure are longer than the net exposure time of the fragmented short exposure and the continuous short exposure, respectively, and the first exposure period of the first photodiode is a continuous long exposure that is longer in duration than any of the plurality of exposure periods of the second photodiode.

A method of manufacturing an apparatus for LED flicker mitigation in image sensors is described. The method may include providing a timing controller circuit that generates at least one control signal that controls an operation of the image sensor, providing at least one pixel, in which the at least one pixel comprises a split photodiode pixel including at least two or more photodiodes that are configured to be exposed to one or more bursts of light from a light source, the at least two or more photodiodes are configured to be exposed and blanked independently of each other, the two or more photodiodes include a first photodiode that has a first exposure period that is longer in duration than a second exposure period of a second photodiode of the two or more photodiodes, and the timing controller circuit is configured to control a plurality of exposures performed by the second photodiode of the at least one pixel to include a fragmented medium exposure, a continuous medium exposure, a fragmented short exposure, and a continuous short exposure, wherein the fragmented medium exposure and the continuous medium exposure are longer than the net exposure time of the fragmented short exposure and the continuous short exposure, respectively, and the first exposure period of the first photodiode is a continuous long exposure that is longer in duration than any of the plurality of exposure periods of the second photodiode.

A method of using an apparatus for LED flicker mitigation in image sensors is described. The method may include using a timing controller circuit that generates at least one control signal that controls an operation of the image sensor, using at least one pixel, in which the at least one pixel comprises a split photodiode pixel including at least two or more photodiodes that are configured to be exposed to one or more bursts of light from a light source, the at least two or more photodiodes are configured to be exposed and blanked independently of each other, the two or more photodiodes include a first photodiode that has a first exposure period that is longer in duration than a second exposure period of a second photodiode of the two or more photodiodes, and the timing controller circuit is configured to control a plurality of exposures performed by the second photodiode of the at least one pixel to include a fragmented medium exposure, a continuous medium exposure, a fragmented short exposure, and a continuous short exposure, wherein the fragmented medium exposure and the continuous medium exposure are longer than the net exposure time of the fragmented short exposure and the continuous short exposure, respectively, and the first exposure period of the first photodiode is a continuous long exposure that is longer in duration than any of the plurality of exposure periods of the second photodiode.

In some examples of the apparatus and method described above, the timing controller circuit is configured to control the second photodiode to perform a fragmented exposure operation in which a plurality of exposure periods of the second photodiode are shorter in duration than the first exposure period of the first photodiode, and the plurality of exposure periods of the second photodiode include both continuous and fragmented exposure periods to capture the one or more bursts of light.

In some examples of the apparatus and method described above, the first exposure period of the first photodiode comprises a continuous exposure, and the timing control circuit is configured to control the fragmented exposure operation performed by the second photodiode that includes dividing the plurality of exposure periods into N parts that are distributed evenly over operation of the second photodiode.

In some examples of the apparatus and method described above, the fragmented exposure operation performed by the second photodiode occurs during the first exposure period of the first photodiode. In some examples of the apparatus and method described above, the timing controller circuit receives an input signal to activate the image sensor and capture bursts of light from a light source. In some examples of the apparatus and method described above, the light source comprises an LED light source. In some examples of the apparatus and method described above, the image sensor comprises an High Dynamic Range (HDR) image sensor.

A method for LED flicker mitigation in image sensors is described. The method may include generating, by a timing controller circuit, at least one control signal that controls an operation of the image sensor, the image sensor including at least one pixel having a split photodiode pixel including at least two or more photodiodes that are configured by the control signal from the timing controller circuit to be exposed to one or more bursts of light from a light source, the at least two or more photodiodes are configured to be exposed and blanked independently of each other, controlling, by the timing controller circuit, a first exposure period of a first photodiode of the two or more photodiodes to be longer in duration than a second exposure period of a second photodiode of the two or more photodiodes, performing by the second photodiode, a fragmented exposure operation in which a plurality of exposure periods of the second photodiode are shorter in duration than the first exposure period of the first photodiode, and the plurality of exposure periods of the second photodiode include both continuous and fragmented exposure periods to capture the one or more bursts of light, outputting by the split photodiode (split-PD) pixel to at least one of a memory or the timing controller circuit, and the plurality of exposure periods of the second photodiode of the at least one pixel in the image sensor include a fragmented medium exposure, a continuous medium exposure, a fragmented short exposure, and a continuous short exposure, wherein the fragmented medium exposure and the continuous medium exposure are longer in duration than the net exposure time of the fragmented short exposure and the continuous short exposure, respectively, and the first exposure period of the first photodiode is a continuous long exposure that is longer in duration than any of the plurality of exposure periods of the second photodiode.

An apparatus for LED flicker mitigation in image sensors is described. The apparatus may include a processor, memory in electronic communication with the processor, and instructions stored in the memory. The instructions may be operable to cause the processor to generate, by a timing controller circuit, at least one control signal that controls an operation of the image sensor, the image sensor including at least one pixel having a split photodiode pixel including at least two or more photodiodes that are configured by the control signal from the timing controller circuit to be exposed to one or more bursts of light from a light source, the at least two or more photodiodes are configured to be exposed and blanked independently of each other, control, by the timing controller circuit, a first exposure period of a first photodiode of the two or more photodiodes to be longer in duration than a second exposure period of a second photodiode of the two or more photodiodes, perform by the second photodiode, a fragmented exposure operation in which a plurality of exposure periods of the second photodiode are shorter in duration than the first exposure period of the first photodiode, and the plurality of exposure periods of the second photodiode include both continuous and fragmented exposure periods to capture the one or more bursts of light, output by the split-PD pixel to at least one of a memory or the timing controller circuit, and the plurality of exposure periods of the second photodiode of the at least one pixel in the image sensor include a fragmented medium exposure, a continuous medium exposure, a fragmented short exposure, and a continuous short exposure, wherein the fragmented medium exposure and the continuous medium exposure are longer in duration than the net exposure time of the fragmented short exposure and the continuous short exposure, respectively, and the first exposure period of the first photodiode is a continuous long exposure that is longer in duration than any of the plurality of exposure periods of the second photodiode.

A non-transitory computer readable medium storing code for LED flicker mitigation in image sensors is described. In some examples, the code comprises instructions executable by a processor to: generate, by a timing controller circuit, at least one control signal that controls an operation of the image sensor, the image sensor including at least one pixel having a split photodiode pixel including at least two or more photodiodes that are configured by the control signal from the timing controller circuit to be exposed to one or more bursts of light from a light source, the at least two or more photodiodes are configured to be exposed and blanked independently of each other, control, by the timing controller circuit, a first exposure period of a first photodiode of the two or more photodiodes to be longer in duration than a second exposure period of a second photodiode of the two or more photodiodes, perform by the second photodiode, a fragmented exposure operation in which a plurality of exposure periods of the second photodiode are shorter in duration than the first exposure period of the first photodiode, and the plurality of exposure periods of the second photodiode include both continuous and fragmented exposure periods to capture the one or more bursts of light, output by the split-PD pixel to at least one of a memory or the timing controller circuit, and the plurality of exposure periods of the second photodiode of the at least one pixel in the image sensor include a fragmented medium exposure, a continuous medium exposure, a fragmented short exposure, and a continuous short exposure, wherein the fragmented medium exposure and the continuous medium exposure are longer in duration than the net exposure time of the fragmented short exposure and the continuous short exposure, respectively, and the first exposure period of the first photodiode is a continuous long exposure that is longer in duration than any of the plurality of exposure periods of the second photodiode.

In some examples of the method, apparatus, and non-transitory computer-readable medium described above, the first exposure period of the first photodiode comprises a continuous exposure, and controlling, by the timing control circuit, operation of the fragmented exposure periods performed by the second photodiode that includes dividing the plurality of exposure periods into N parts, and distributing the N parts evenly over operation of the second photodiode.

In some examples of the method, apparatus, and non-transitory computer-readable medium described above, the fragmented exposure operation by the second photodiode is performed during the first exposure period of the first photodiode. In some examples of the method, apparatus, and non-transitory computer-readable medium described above, the image sensor comprises an HDR image sensor.

An apparatus for LED flicker mitigation in image sensors is described. The apparatus may include a timing controller circuit that generates at least one control signal that controls an operation of the HDR image sensor, at least one pixel, in which the at least one pixel comprises a split photodiode pixel including at least two or more photodiodes that are configured to be exposed to one or more bursts of light from a light source, the at least two or more photodiodes are configured to be exposed and blanked independently of each other, the two or more photodiodes include a first photodiode that has a first exposure period that is longer in duration than a second exposure period of a second photodiode of the two or more photodiodes, and the timing controller circuit is configured to control a plurality of exposures performed by the second photodiode of the at least one pixel to include at least five exposures.

A method of using an apparatus for LED flicker mitigation in image sensors is described. The method may include using a timing controller circuit that generates at least one control signal that controls an operation of the HDR image sensor, using at least one pixel, in which the at least one pixel comprises a split photodiode pixel including at least two or more photodiodes that are configured to be exposed to one or more bursts of light from a light source, the at least two or more photodiodes are configured to be exposed and blanked independently of each other, the two or more photodiodes include a first photodiode that has a first exposure period that is longer in duration than a second exposure period of a second photodiode of the two or more photodiodes, and the timing controller circuit is configured to control a plurality of exposures performed by the second photodiode of the at least one pixel to include at least five exposures.

In some examples of the apparatus and method described above, the at least five exposures include a fragmented medium exposure, a continuous medium exposure, a fragmented short exposure, and a continuous short exposure, wherein the fragmented medium exposure and the continuous medium exposure are longer in duration than the net exposure time of the fragmented short exposure and the continuous short exposure, respectively, and the first exposure period of the first photodiode is a continuous long exposure that is longer in duration than any of the plurality of exposure periods of the second photodiode.

An apparatus for LED flicker mitigation in image sensors is described. The apparatus may include an array of split photodiode pixels configured to be exposed and blanked independently of each other together with fragmented exposures, at least a first photodiode in the array of split photodiode pixels is configured for a continuous long exposure, a second photodiode is configured for fragmented exposures including medium exposures and shorter exposure, and a timing controller for outputting control signals to average an LED modulation and to synchronize the medium exposures and the shorter exposures.

A method of using an apparatus for LED flicker mitigation in image sensors is described. The method may include using an array of split photodiode pixels configured to be exposed and blanked independently of each other together with fragmented exposures, using at least a first photodiode in the array of split photodiode pixels is configured for a continuous long exposure, a second photodiode is configured for fragmented exposures including medium exposures and shorter exposure, and using a timing controller for outputting control signals to average an LED modulation and to synchronize the medium exposures and the shorter exposures.

DETAILED DESCRIPTION

Figure 1:
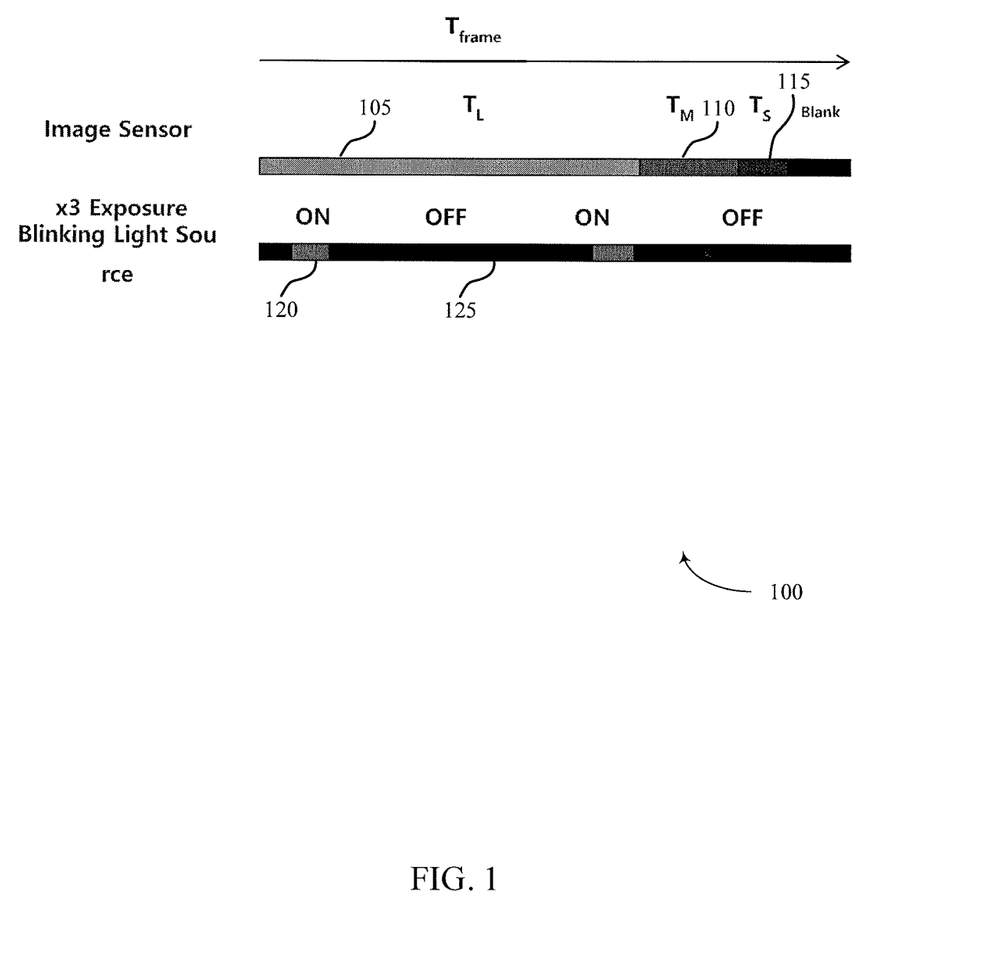
FIG. 1 shows an example of a frame of a predetermined duration in accordance with aspects of the present disclosure.

FIG. 1 shows an example of a frame 100 of a predetermined duration in accordance with aspects of the present disclosure. The example shown includes frame 100, longer exposure periods 105 ($T_L$), medium exposure periods 110 ($T_M$), shorter exposure periods 115 ($T_S$), light on periods 120, and light off periods 125.

In some cases, the duration of frame 100 may be the reciprocal of the frequency. Shown is a non-limiting example of the exposure periods of an image sensor. For example, an image sensor may have, as shown in FIG. 1, exposure periods $T_L$, $T_M$ and $T_S$ respectively referring to a longer exposure period 105, a medium exposure period 110, and a shorter exposure period 115 (relative to each other), and "Blank" refers to a blanking period. It can also be seen that a relatively short burst of a blinking light source (e.g. FIG. 1 shows a duty cycle of about 10%) may be missed by image sensor in the medium exposure period 110 $T_M$ and in the shorter exposure period 115 $T_S$ in a frame 100. For example, FIG. 1 shows that in the medium $T_M$ period and the shorter $T_S$ period, for this particular frame 100, the burst of lights are missed completely. In other words, the source (in this case blinking with a relative low duty cycle) may be perceived by the medium exposure and the shorter exposure as being off.

However, although FIG. 1 shows a case where the exposure period of an image sensor misses a burst of light during a $T_M$ exposure period or a $T_S$ exposure period, over the course of several frames, the image sensor may not always miss the burst of light. Accordingly, the light emitting diode (LED) burst of light may be visible in one frame 100 but not visible (e.g., missed) in the next or future frame. Such intermittent missing of the LED bursts of light in a frame 100 may appear as a flickering of an image sequence. In applications such as autonomous vehicles, flickering may impact the quality of the image sensor. For example, in an autonomous vehicle there may be a result where the state of a traffic light is missed (e.g., red or green light) because of asynchronicity between the exposure time and light modulation. In addition, other parts of the vehicle (e.g., LED headlights and LED tail lights) may have a flickering output that could affect the sensing of the present vehicle by other autonomous vehicles within proximity of the present vehicle.

Frame 100, longer exposure periods 105, medium exposure periods 110, shorter exposure periods 115, light on periods 120, and light off periods 125 may be an example of, or include aspects of, the corresponding elements described with reference to FIGS. 4, 5, and 6.

Figure 2:
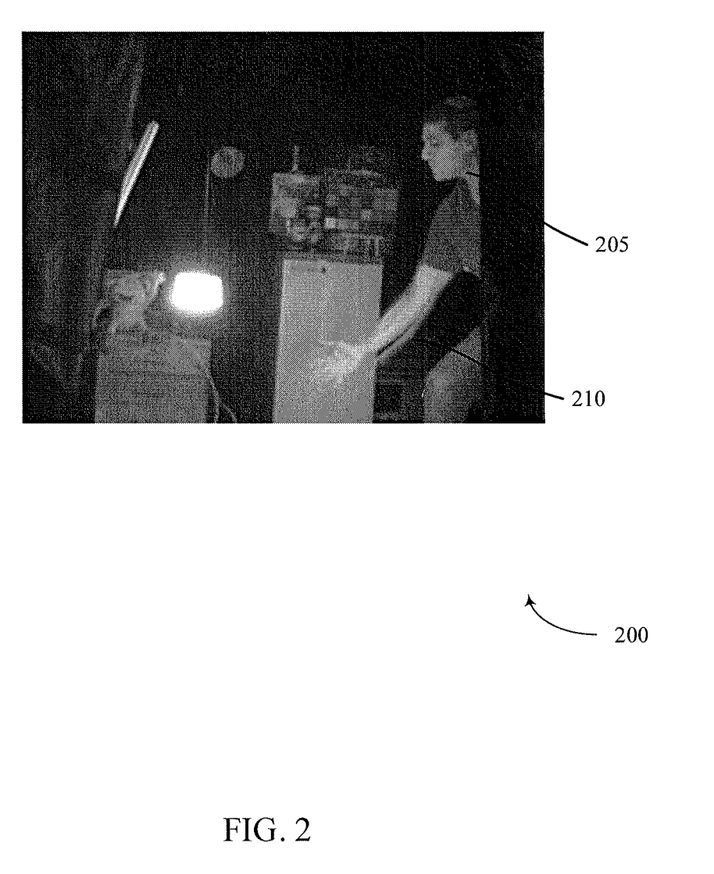
FIG. 2 shows an example of an image of ghosting of an object in accordance with aspects of the present disclosure.

FIG. 2 shows an example of an image 200 of ghosting 210 of an object in accordance with aspects of the present disclosure. The example shown includes image 200. Image 200 may include person 205 and ghosting 210.

In a high dynamic range imaging, the use of multiple exposures to obtain an image 200 may create an inherent synchronicity between the different exposures of the same scene. In a static scene, the inherent synchronicity may be negligible. However, when there is motion, dynamic scenes having different exposures may result in ghosting 210 of moving objects. For example, in FIG. 2, the person 205 moved his arm, and the use of multiple exposures resulting in ghosting 210 of the moving arm.

Figure 3:
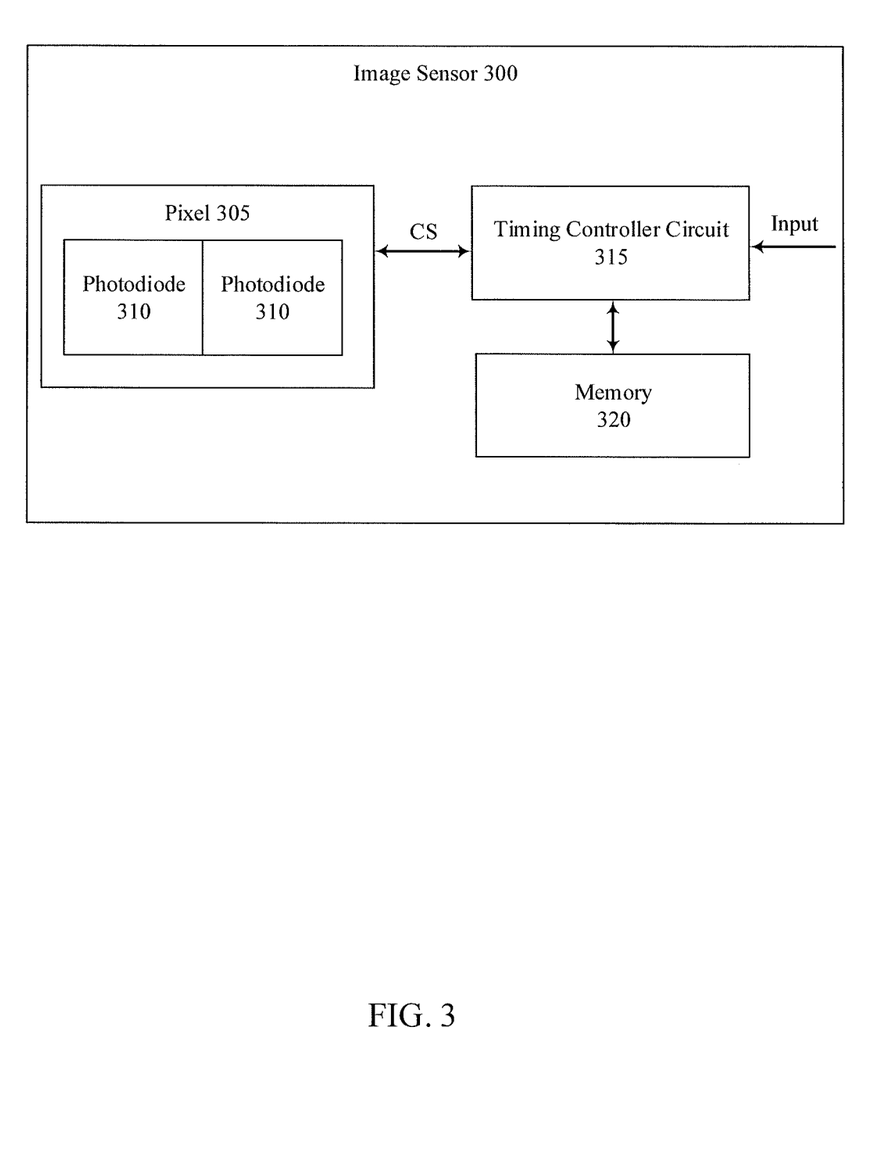
FIG. 3 shows an example of a schematic of an image sensor in accordance with aspects of the present disclosure.

FIG. 3 shows an example of a schematic of an image sensor 300 in accordance with aspects of the present disclosure. Image sensor 300 may include an array of pixels 305, timing controller circuit 315 (which may include or operate in conjunction with one or more processors), and memory 320. Each pixel 305 may include one or more photodiodes 310.

The image sensor 300 may be a complementary metal-oxide-semiconductor (CMOS) image sensor 300 including an array of pixels 305. The image sensor 300 may be configured as a High Dynamic Range (HDR) sensor. For example, an HDR sensor may be constructed of one or more split photodiode (split-PD) pixels 305 (e.g., a specialized pixel 305 with two or more photodiodes 310 that can be exposed and blanked independently of each other) together with fragmented exposures (e.g., a method in which medium exposures and shorter exposures (e.g., $T_M$, $T_S$ in FIG. 1).

The exposure time of the split-PD pixels 305 may be divided into N parts and distributed evenly throughout the long exposure (e.g., $T_L$, in FIG. 1) may address some of the issues associated with LED flickering and ghosting. However, the use of one or more split-PD pixels 305 with a method of fragmented exposures may be performed by selecting one photodiode 310 in the split-PD pixel 305 for a continuous long exposure, and by fragmenting the medium exposures and the shorter exposures over the second photodiode 310 in the split-PD pixel 305. By the use of two split pixels 305 selected for different exposure times, as described in more detail herein below, the LED modulation and the medium exposures and the shorter exposures may be synchronized For example the split-PD pixel 305 maybe selected for a continuous long exposure, and the split-pixel 305 PD may be selected for fragmenting the medium exposures $T_M$ and the shorter exposures $T_S$.

A timing controller circuit 315, in response to an input, may generate control signals used to operate the image sensor 300. For example, the timing controller circuit 315 may generate a control signal that controls operation of pixels 305, so that they are controlled to provide exposure periods and blank periods of predetermined durations. It is during the exposure periods that the split-PD pixels 305 may sense the bursts of light output by the light source. Although the timing controller circuit 315 shows a single input, there may be an additional input, for example, a clock signal from an external source.

The pixel 305 may be a split photodiode pixel including at least two or more photodiodes 310 that are configured to be exposed to one or more bursts of light from a light source, where the at least two or more photodiodes 310 are configured to be exposed and blanked independently of each other. The pixel 305 may output to at least one of a memory or the timing controller circuit 315. The pixels 305 may be exposed and blanked independently of each other together with fragmented exposures.

A photodiode 310 may perform a fragmented exposure operation in which a plurality of exposure periods of the second photodiode 310 are shorter in duration than the first exposure period of the first photodiode 310, and the plurality of exposure periods of the second photodiode 310 include both continuous and fragmented exposure periods to capture the one or more bursts of light. The photodiode 310 may be one of an array of split photodiode pixels configured for a continuous long exposure, including a second photodiode 310 configured for fragmented exposures including medium exposures and shorter exposure.

In some examples, the two or more photodiodes 310 may include a first photodiode 310 that has a first exposure period that is longer in duration than a second exposure period of a second photodiode 310 of the two or more photodiodes 310.

The timing controller circuit 315 may generate at least one control signal that controls an operation of the image sensor 300, the image sensor 300 including at least one pixel 305 having a split photodiode pixel including at least two or more photodiodes 310 that are configured by the control signal from the timing controller circuit 315 to be exposed to one or more bursts of light from a light source, the at least two or more photodiodes 310 are configured to be exposed and blanked independently of each other. The timing controller circuit 315 may also control a first exposure period of a first photodiode 310 of the two or more photodiodes 310 to be longer in duration than a second exposure period of a second photodiode 310 of the two or more photodiodes 310. The timing controller circuit 315 may also output control signals to average an LED modulation and to synchronize the medium exposures and the shorter exposures.

In some examples, the timing controller circuit 315 is configured to control a plurality of exposures performed by the second photodiode 310 of the at least one pixel 305 to include a fragmented medium exposure, a continuous medium exposure, a fragmented short exposure, and a continuous short exposure, wherein the fragmented medium exposure and the continuous medium exposure are longer than the net exposure time of the fragmented short exposure and the continuous short exposure, respectively, and the first exposure period of the first photodiode 310 is a continuous long exposure that is longer in duration than any of the plurality of exposure periods of the second photodiode 310.

In some examples, the timing controller circuit 315 is configured to control the second photodiode 310 to perform a fragmented exposure operation in which a plurality of exposure periods of the second photodiode 310 are shorter in duration than the first exposure period of the first photodiode 310, and the plurality of exposure periods of the second photodiode 310 include both continuous and fragmented exposure periods to capture the one or more bursts of light.

In some examples, the first exposure period of the first photodiode 310 comprises a continuous exposure, and the timing control circuit is configured to control the fragmented exposure operation performed by the second photodiode 310 that includes dividing the plurality of exposure periods into N parts that are distributed evenly over operation of the second photodiode 310. In some examples, the fragmented exposure operation performed by the second photodiode 310 occurs during the first exposure period of the first photodiode 310. In some examples, the timing controller circuit 315 receives an input signal to activate the image sensor 300 and capture bursts of light from a light source. In some examples, the light source comprises an LED light source.

In some examples, the plurality of exposure periods of the second photodiode 310 of the at least one pixel 305 in the image sensor 300 include a fragmented medium exposure, a continuous medium exposure, a fragmented short exposure, and a continuous short exposure, wherein the fragmented medium exposure and the continuous medium exposure are longer in duration than the net exposure time of the fragmented short exposure and the continuous short exposure, respectively, and the first exposure period of the first photodiode 310 is a continuous long exposure that is longer in duration than any of the plurality of exposure periods of the second photodiode 310.

In some examples, the first exposure period of the first photodiode 310 comprises a continuous exposure, and controlling, by the timing control circuit, operation of the fragmented exposure periods performed by the second photodiode 310 that includes dividing the plurality of exposure periods into N parts, and distributing the N parts evenly over operation of the second photodiode 310. In some examples, the fragmented exposure operation by the second photodiode 310 is performed during the first exposure period of the first photodiode 310.

Figure 4:
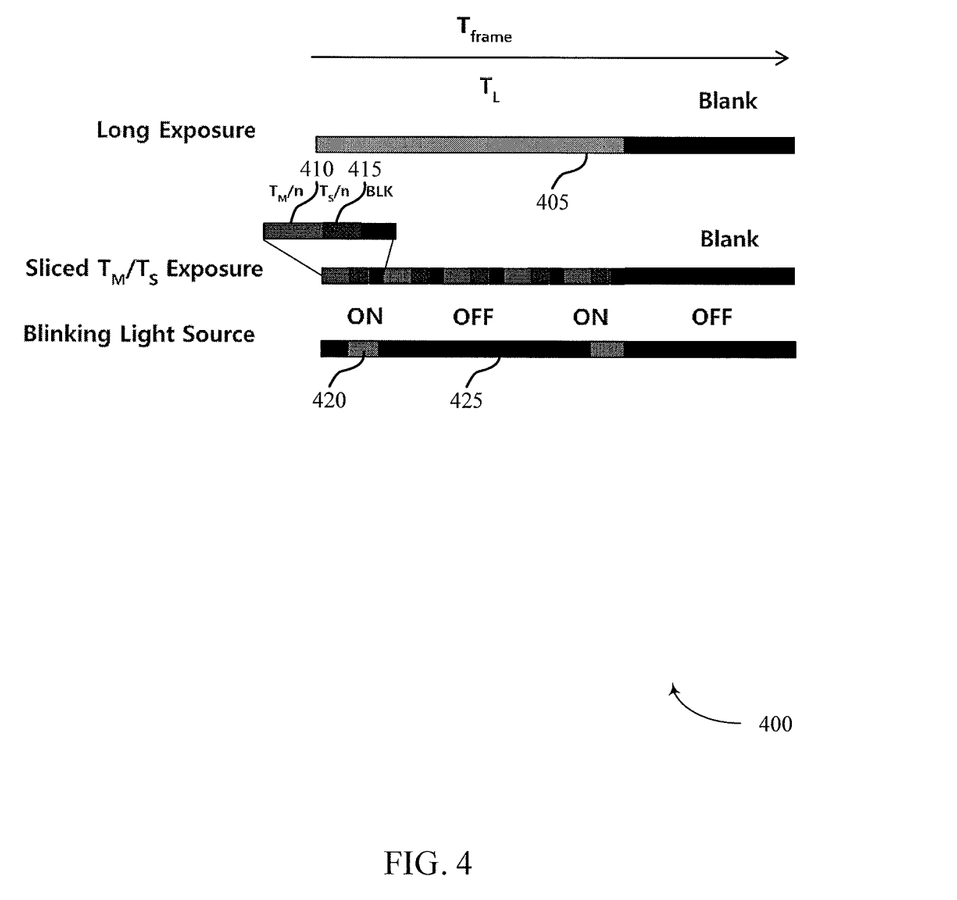
FIG. 4 shows an example of a temporal illustration of the operation of the split photodiode (split-PD) pixel and the fragmented exposures in accordance with aspects of the present disclosure.

FIG. 4 shows an example of a temporal illustration of the operation of the split-PD pixel and the fragmented exposures in accordance with aspects of the present disclosure. The example shown includes frame 400, longer exposure periods 405, medium exposure periods 410, shorter exposure periods 415, light on periods 420, and light off periods 425.

FIG. 4 includes all exposures have a same duration but the accumulation time is long. It can be seen from FIG. 4 that the sliced $T_M/T_S$ exposure includes the medium exposure $T_M$ and the shorter exposure $T_S$. Although the use of a split-PD and fragmented exposures may address the LED flicker and ghosting issues as described herein above, a motion blur may be introduced, and such motion blur may result in overall blurry images.

Frame 400, longer exposure periods 405, medium exposure periods 410, shorter exposure periods 415, light on periods 420, and light off periods 425 may be an example of, or include aspects of, the corresponding elements described with reference to FIGS. 1, 5, and 6.

Figure 5:
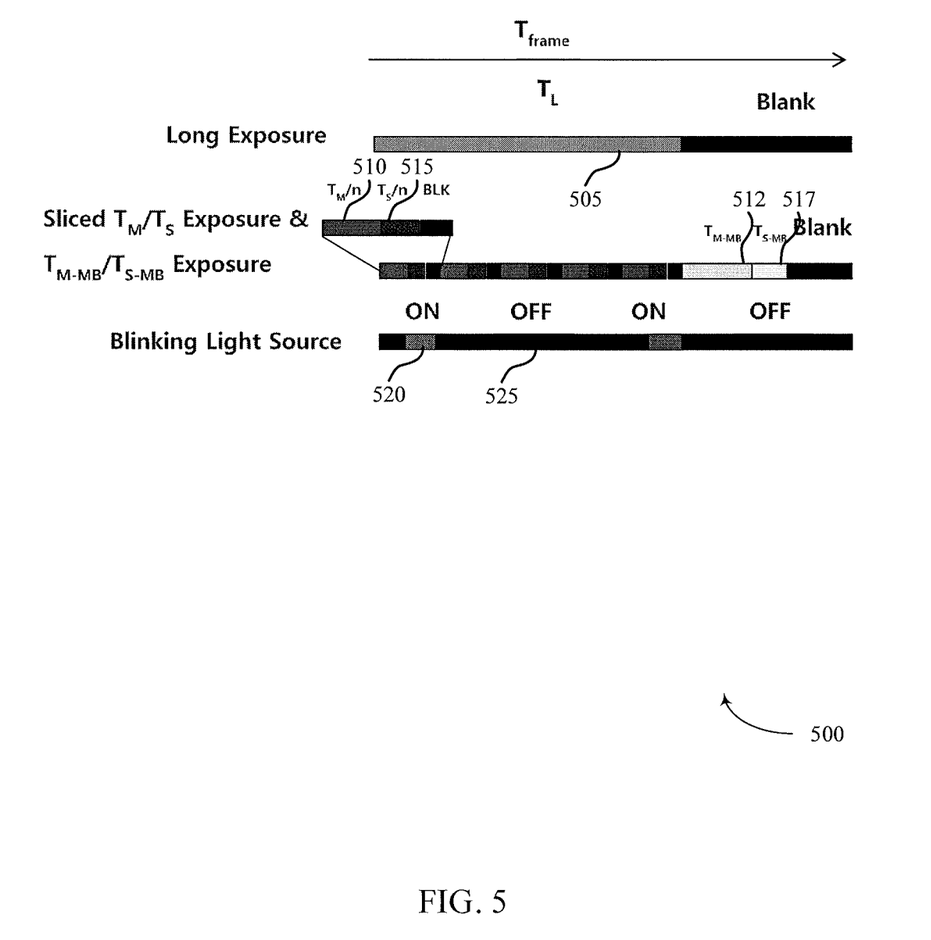
FIG. 5 shows an example of a temporal illustration of an embodiment of the inventive concept in accordance with aspects of the present disclosure.

FIG. 5 shows an example of a temporal illustration of an embodiment of the inventive concept in accordance with aspects of the present disclosure. The example shown includes frame 500, longer exposure periods 505, medium exposure periods 510, continuous medium exposure period 512, shorter exposure periods 515, continuous shorter exposure period 517, light on periods 520, and light off periods 525.

In this embodiment, a split-PD with fragmented exposure includes adding two continuous shorter exposures $T_S$ and medium exposures $T_M$ that may reduce the motion blur caused by the fragmented exposure as discussed herein above. Moreover, this embodiment of the inventive concept does not sacrifice the performance with respect to LED flicker mitigation and ghosting prevention.

With reference to FIG. 5, in the frame 500 $T_{frame}$ there is both a sliced exposure ($T_M/n$ $T_S/n$ and blank) and two continuous exposures $T_{M-MB}$ and $T_{S-SB}$. The use of the additional information, for example, one shorter exposure being fragmented and another shorter exposure being continuous, may facilitate identifying contradictions between the different exposures. For example, there is a contradiction in the instance where a flickering LED will be clearly visible in a fragmented short exposure, but may not be visible (or alternatively may saturate) the continuous short exposure. This contradiction (noise/saturation vs. acceptable value) may lead to a determination that the pixel is a flickering light source and adjust the merging accordingly by redistributing the merging weights. In addition, according to an embodiment of the inventive concept, the longer exposure $T_L$ may not be sufficiently long to negate LED flickering in, for example a very brightly lit scene. In this embodiment of the inventive concept, additional exposures may also be fragmented to enhance capturing and averaging the LED.

Frame 500, longer exposure periods 505, medium exposure periods 510, shorter exposure periods 515, light on periods 520, and light off periods 525 may be an example of, or include aspects of, the corresponding elements described with reference to FIGS. 1, 4, and 6.

Figure 6:
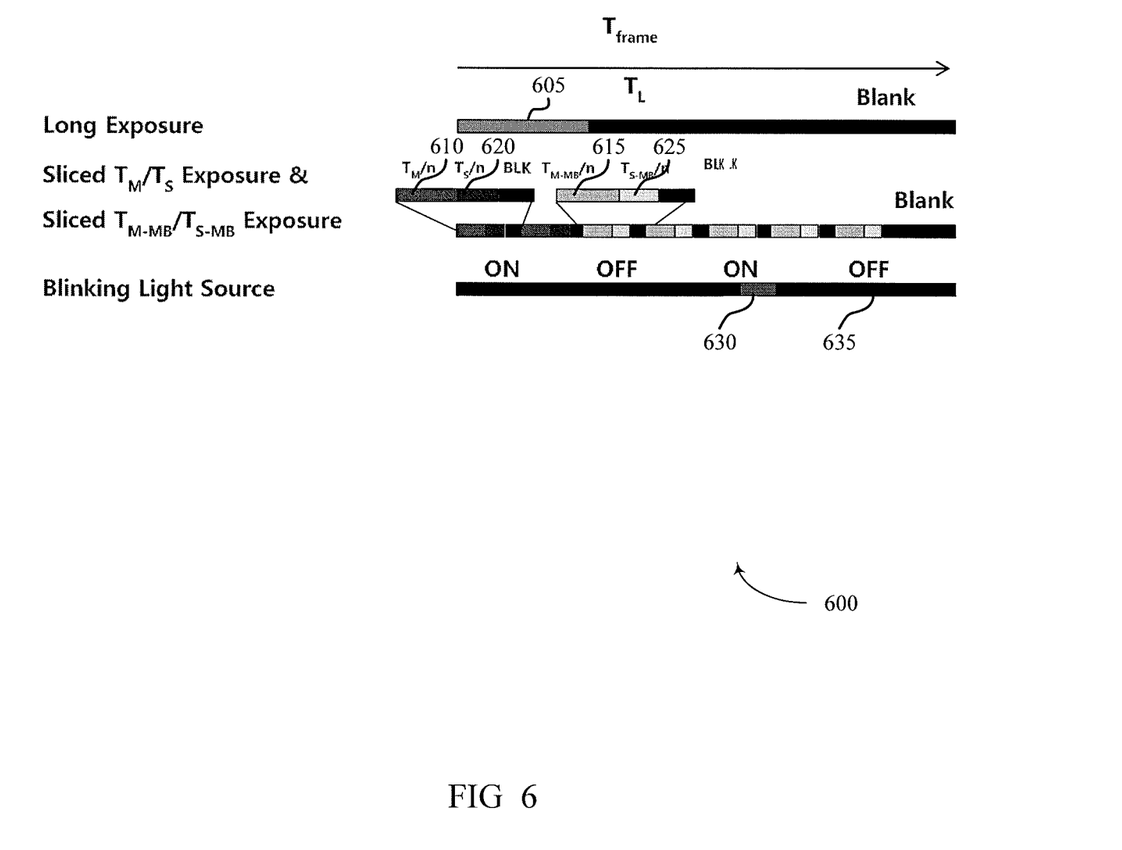
FIG. 6 shows an example of a temporal illustration in which an additional fragmented exposure is performed to mitigate light emitting diode (LED) flicker in extremely illuminated conditions in accordance with aspects of the present disclosure.

FIG. 6 shows an example of a temporal illustration in which an additional fragmented exposure is performed to mitigate LED flicker in extremely illuminated conditions in accordance with aspects of the present disclosure. The example shown includes frame 600, longer exposure periods 605, fragmented medium exposure periods 610, continuous medium exposure periods 615, fragmented short exposure periods 620, continuous short exposure periods 625, light on periods 630, and light off periods 635.

With reference to FIG. 5, it can be seen, for example, that FIG. 6 shows additional fragmented exposures. That is, according to an embodiment of the inventive concept, the split-pixel PD may includes five exposures: Long, Fragmented Medium, Continuous Medium, Fragmented Short, and Continuous Short. The split-pixel PD provides information regarding the scene to reduce motion blur and to ensure that all flickering LED information is captured in the images. According to embodiments of the inventive concept, the motion blur that may be introduced by LED flicker mitigation (LFM) is addressed by modifying an image sensor comprised of one or more split-pixel PDs that includes a medium and short continuous exposure to the sensor.

Frame 600, longer exposure periods 605, light on periods 630, and light off periods 635 may be an example of, or include aspects of, the corresponding elements described with reference to FIGS. 1, 4, and 5.

Figure 7:
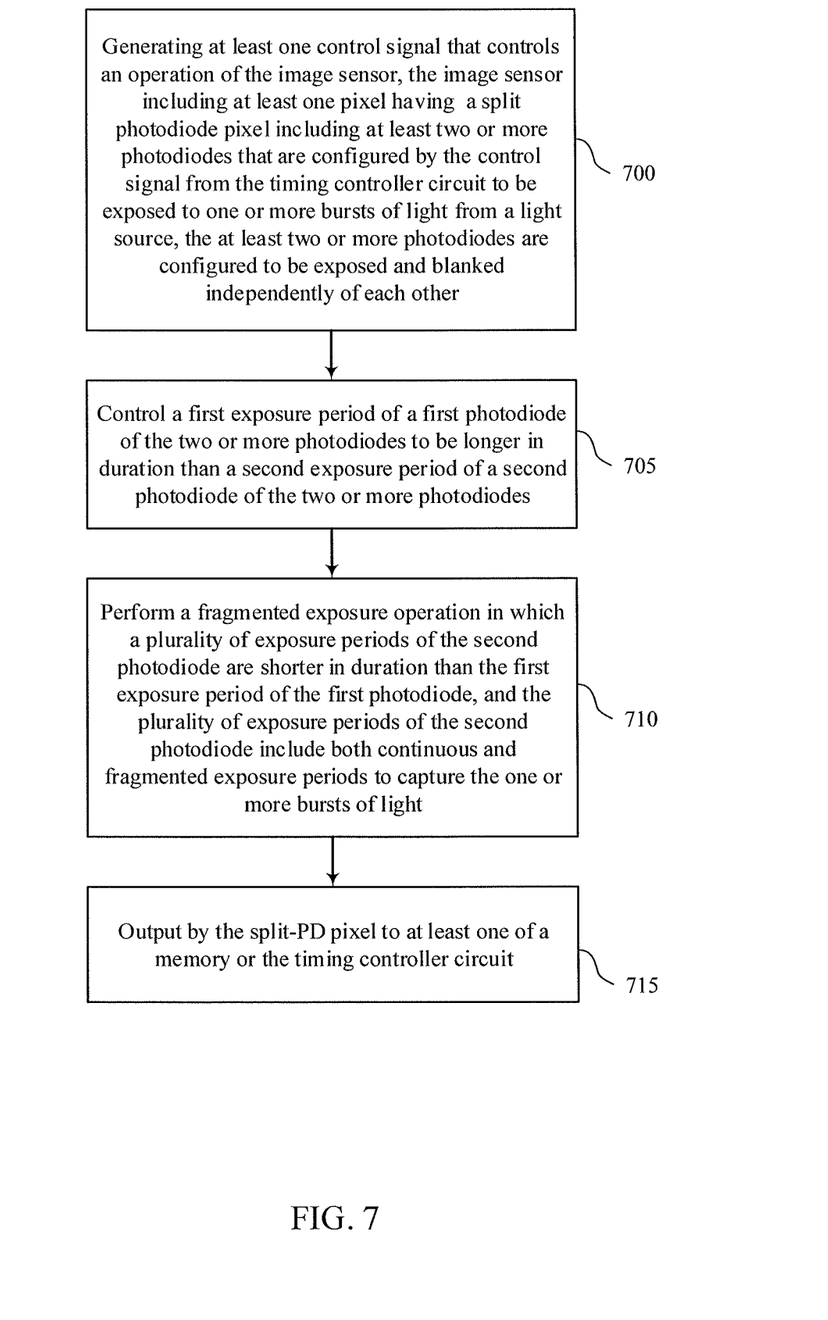
FIG. 7 shows an example of a process for mitigating LED flicker in accordance with aspects of the present disclosure.

FIG. 7 shows an example of a process for mitigating LED flicker in accordance with aspects of the present disclosure. In some examples, these operations may be performed by a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At step 700, a system may generating at least one control signal that controls an operation of the image sensor, the image sensor including at least one pixel having a split photodiode pixel including at least two or more photodiodes that are configured by the control signal from the timing controller circuit to be exposed to one or more bursts of light from a light source, the at least two or more photodiodes are configured to be exposed and blanked independently of each other. In some cases, the operations of this step may be performed by a timing controller circuit as described with reference to FIG. 3.

At step 705, a system may control a first exposure period of a first photodiode of the two or more photodiodes to be longer in duration than a second exposure period of a second photodiode of the two or more photodiodes. In some cases, the operations of this step may be performed by a timing controller circuit as described with reference to FIG. 3.

At step 710, a system may perform a fragmented exposure operation in which a plurality of exposure periods of the second photodiode are shorter in duration than the first exposure period of the first photodiode, and the plurality of exposure periods of the second photodiode include both continuous and fragmented exposure periods to capture the one or more bursts of light. In some cases, the operations of this step may be performed by a photodiode as described with reference to FIG. 3.

At step 715, a system may output by the split-PD pixel to at least one of a memory or the timing controller circuit. In some cases, the operations of this step may be performed by a pixel as described with reference to FIG. 3.

In some cases, the plurality of exposure periods of the second photodiode of the at least one pixel in the image sensor include a fragmented medium exposure, a continuous medium exposure, a fragmented short exposure, and a continuous short exposure, wherein the fragmented medium exposure and the continuous medium exposure are longer in duration than the net exposure time of the fragmented short exposure and the continuous short exposure, respectively, and the first exposure period of the first photodiode is a continuous long exposure that is longer in duration than any of the plurality of exposure periods of the second photodiode.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described methods may be implemented or performed by devices that include a general-purpose processor, a DSP, an ASIC, an FPGA or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise RAM, ROM, electrically erasable programmable read only memory (EEPROM), compact disk (CD) ROM or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, digital subscriber line (DSL), or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on."

What is claimed is:

1. An apparatus for light emitting diode (LED) flicker mitigation in an image sensor, comprising:
   a timing controller circuit that generates at least one control signal that controls an operation of the image sensor;
   at least one pixel, in which the at least one pixel comprises a split photodiode pixel including at least two or more photodiodes that are configured to be exposed to one or more bursts of light from a light source, the at least two or more photodiodes are configured to be exposed and blanked independently of each other;
   wherein the two or more photodiodes include a first photodiode that has a first exposure period that is longer in duration than a second exposure period of a second photodiode of the two or more photodiodes; and
   wherein the timing controller circuit is configured to control a plurality of exposures performed by the second photodiode of the at least one pixel to include a fragmented medium exposure, a continuous medium exposure, a fragmented short exposure, and a continuous short exposure, wherein the fragmented medium exposure and the continuous medium exposure are longer than a net exposure time of the fragmented short exposure and the continuous short exposure, respectively, and the first exposure period of the first photodiode is a continuous long exposure that is longer in duration than any of a plurality of exposure periods of the second photodiode.

2. The apparatus of claim 1, wherein:
the timing controller circuit is configured to control the second photodiode to perform a fragmented exposure operation in which the plurality of exposure periods of the second photodiode are shorter in duration than the first exposure period of the first photodiode, and the plurality of exposure periods of the second photodiode include both continuous and fragmented exposure periods to capture the one or more bursts of light.

3. The apparatus of claim 1, wherein:
the first exposure period of the first photodiode comprises a continuous exposure, and the timing controller circuit is configured to control a fragmented exposure operation performed by the second photodiode that includes dividing the plurality of exposure periods into N parts that are distributed evenly over operation of the second photodiode.

4. The apparatus of claim 3, wherein:
the fragmented exposure operation performed by the second photodiode occurs during the first exposure period of the first photodiode.

5. The apparatus of claim 4, wherein:
the timing controller circuit receives an input signal to activate the image sensor and capture bursts of light from the light source.

6. The apparatus of claim 5, wherein:
the light source comprises an light emitting diode (LED) light source.

7. The apparatus of claim 1, wherein:
the image sensor comprises an High Dynamic Range (HDR) image sensor.

8. A method of using an apparatus for light emitting diode (LED) flicker mitigation in image sensors, the method comprising:
using a timing controller circuit that generates at least one control signal that controls an operation of the image sensors;
using at least one pixel, in which the at least one pixel comprises a split photodiode pixel including at least two or more photodiodes that are configured to be exposed to one or more bursts of light from a light source, the at least two or more photodiodes are configured to be exposed and blanked independently of each other;
wherein the two or more photodiodes include a first photodiode that has a first exposure period that is longer in duration than a second exposure period of a second photodiode of the two or more photodiodes; and
wherein the timing controller circuit is configured to control a plurality of exposures performed by the second photodiode of the at least one pixel to include a fragmented medium exposure, a continuous medium exposure, a fragmented short exposure, and a continuous short exposure, wherein the fragmented medium exposure and the continuous medium exposure are longer than a net exposure time of the fragmented short exposure and the continuous short exposure, respectively, and the first exposure period of the first photodiode is a continuous long exposure that is longer in duration than any of a plurality of exposure periods of the second photodiode.

9. The method of claim 8, wherein:
the timing controller circuit is configured to control the second photodiode to perform a fragmented exposure operation in which a plurality of exposure periods of the second photodiode are shorter in duration than the first exposure period of the first photodiode, and the plurality of exposure periods of the second photodiode include both continuous and fragmented exposure periods to capture the one or more bursts of light.

10. The method of claim 8, wherein:
the first exposure period of the first photodiode comprises a continuous exposure, and the timing controller circuit is configured to control a fragmented exposure operation performed by the second photodiode that includes dividing the plurality of exposure periods into N parts that are distributed evenly over operation of the second photodiode.

11. The method of claim 10, wherein:
the fragmented exposure operation performed by the second photodiode occurs during the first exposure period of the first photodiode.

12. The method of claim 11, wherein:
the timing controller circuit receives an input signal to activate the image sensors and capture bursts of light from the light source.

13. The method of claim 12, wherein:
the light source comprises an LED light source.

14. The method of claim 8, wherein:
the image sensors comprises an High Dynamic Range (HDR) image sensor.

15. A method for light emitting diode (LED) flicker mitigation in image sensors, comprising:
generating, by a timing controller circuit, at least one control signal that controls an operation of the image sensors, the image sensors including at least one pixel having a split photodiode pixel including at least two or more photodiodes that are configured by the control signal from the timing controller circuit to be exposed to one or more bursts of light from a light source, the at least two or more photodiodes are configured to be exposed and blanked independently of each other;
controlling, by the timing controller circuit, a first exposure period of a first photodiode of the two or more photodiodes to be longer in duration than a second exposure period of a second photodiode of the two or more photodiodes;
performing by the second photodiode, a fragmented exposure operation in which a plurality of exposure periods of the second photodiode are shorter in duration than the first exposure period of the first photodiode, and the plurality of exposure periods of the second photodiode include both continuous and fragmented exposure periods to capture the one or more bursts of light; and
outputting by the split photodiode (split-PD) pixel to at least one of a memory or the timing controller circuit;
wherein the plurality of exposure periods of the second photodiode of the at least one pixel in the image sensors include a fragmented medium exposure, a continuous medium exposure, a fragmented short exposure, and a continuous short exposure, wherein the fragmented medium exposure and the continuous medium exposure are longer in duration than a net exposure time of the fragmented short exposure and the continuous short exposure, respectively, and the first exposure period of the first photodiode is a continuous long exposure that is longer in duration than any of the plurality of exposure periods of the second photodiode.

16. The method of claim 15, wherein:
the first exposure period of the first photodiode comprises a continuous exposure, and controlling, by the timing controller circuit, operation of the fragmented exposure periods performed by the second photodiode that includes dividing the plurality of exposure periods into N parts, and distributing the N parts evenly over operation of the second photodiode.

17. The method of claim 16, wherein:
the fragmented exposure operation by the second photodiode is performed during the first exposure period of the first photodiode.

18. The method of claim 15, wherein:
the image sensors comprises an High Dynamic Range (HDR) image sensor.

* * * * *